(12) United States Patent
Hiblot (10) Patent No.: US 12,464,805 B2
(45) Date of Patent: Nov. 4, 2025

(54) METHOD FOR FORMING AN INTERCONNECTION STRUCTURE

(71) Applicant: IMEC VZW, Leuven (BE)

(72) Inventor: Gaspard Hiblot, Leuven (BE)

(73) Assignee: IMEC VZW, Leuven (BE)

( * ) Notice: Subject to any disclaimer, the term of this patent is extended or adjusted under 35 U.S.C. 154(b) by 488 days.

(21) Appl. No.: 18/047,060

(22) Filed: Oct. 17, 2022

(65) Prior Publication Data
US 2023/0121515 A1 Apr. 20, 2023

(30) Foreign Application Priority Data
Oct. 18, 2021 (EP) ..................................... 21203176

(51) Int. Cl.
*H10D 84/03* (2025.01)
*H10D 30/67* (2025.01)
(Continued)

(52) U.S. Cl.
CPC ....... *H10D 84/038* (2025.01); *H10D 30/6735* (2025.01); *H10D 64/256* (2025.01); *H10D 84/0149* (2025.01)

(58) Field of Classification Search
CPC ............. H10D 30/6735; H10D 84/038; H10D 84/0149; H10D 64/256; H10D 84/83; H01L 23/535
See application file for complete search history.

(56) References Cited

U.S. PATENT DOCUMENTS 10,236,292 B1 3/2019 Frougler et al.
10,276,476 B1 * 4/2019 Li ...................... H10D 30/6755
(Continued)

FOREIGN PATENT DOCUMENTS

EP 2618481 A1 7/2013
WO 2017105515 A1 6/2017

OTHER PUBLICATIONS

Cheng et al., "A Routability-Driven Complimentary-FET (CFET) Standard Cell Synthesis Framework Using SMT," ICCAD 2020, Nov. 2-5, 2020, Virtual Event, Assoc. Computing Machinery, USA.
(Continued)

*Primary Examiner* — Changhyun Yi
(74) *Attorney, Agent, or Firm* — McDonnell Boehnen Hulbert & Berghoff LLP (57) ABSTRACT

A method for forming an interconnection structure for a first transistor and a second transistor is provided. The first transistor includes a horizontally extending first channel portion and the second transistor includes a horizontally extending second channel portion. The channel portions are stacked above each other on a substrate. The method includes forming a conductive line extending beside and below the second channel portion, forming, on the conductive line, a first vertical interconnect structure for electrically contacting the first channel portion, and thinning the substrate from the backside to expose the conductive line from below. The method further includes forming a via hole exposing the second channel portion from below, filling the via hole with a conductive material to form a second vertical interconnect structure, and forming a conductive structure on the second vertical interconnect structure. A semiconductor device is also provided.

14 Claims, 5 Drawing Sheets

(51) Int. Cl.
*H10D 64/23* (2025.01)
*H10D 84/01* (2025.01)

(56) References Cited

U.S. PATENT DOCUMENTS

| | | |
|---|---|---|
| 10,770,479 B2 | 9/2020 | Smith et al. |
| 10,985,064 B2 | 4/2021 | Zhang et al. |
| 2018/0061766 A1 | 3/2018 | Goktepeli |
| 2020/0006329 A1 | 1/2020 | Lilak et al. |
| 2020/0381300 A1 | 12/2020 | Zhang et al. |
| 2020/0381430 A1 | 12/2020 | Liebmann et al. |
| 2021/0118798 A1 | 4/2021 | Liebmann et al. |
| 2021/0134721 A1 | 5/2021 | Chiang et al. |
| 2021/0242125 A1 | 8/2021 | Do |

OTHER PUBLICATIONS

Extended European Search Report dated May 24, 2022 for the European Patent Application No. 21203176.9.
Han et al., "Design Technology Co-Optimization Towards Sub-3 nm Technology Nodes," J. Semicond., 2021, vol. 42, No. 2, pp. 1-3.
Schuddinick et al., "Device-, Circuit- & Block-level Evaluation of CFET in a 4 Track Library," 2019 Symposium on VLSI Technology Digest of Technical Papers, pp. T204-T205.
Song, Taigon, "Design Aspects and Parasitic Effects on Complementary FETs (CFETs) for 3nm Standard Cells and Beyond," J.Inst.Korean.Electr.Electron.Eng, 2020, vol. 24, No. 3, pp. 845-852.

\* cited by examiner

Fig. 10

# METHOD FOR FORMING AN INTERCONNECTION STRUCTURE

CROSS-REFERENCE

This application claims priority from European Patent Application No. 21203176.9, filed on Oct. 18, 2021, which is incorporated by reference in its entirety.

TECHNICAL FIELD

The present disclosure relates to semiconductor processing in general, and forming of an interconnection structure in particular.

BACKGROUND OF THE PRESENT DISCLOSURE

In effort to provide even more area-efficient circuit designs, vertically stacked semiconductor devices are being developed. One example is the so-called complementary field-effect transistor, FET, design in which two horizontal channel transistors are stacked above each other, such that the horizontal channel portion of a first one of the transistors is arranged above the horizontal channel portion of an other one of the transistors.

The development of vertically stacked designs has however led to challenges in forming electrical interconnection structures for interconnecting devices and structures at different vertical levels. The interconnection structures, which may be arranged in an insulating material layer, may include horizontal conductive paths or lines on different interconnection levels, interconnected by conductive vias extending vertically between the levels. As the length of a conductive via varies with the vertical separation of the levels interconnected by the via, there is also a variation in electrical resistance between different vias. As the resistance tends to increase with increasing via length, it is challenging to balance the resistance between different vias and to avoid too high resistances between some interconnection levels.

SUMMARY OF THE PRESENT DISCLOSURE

It is an objective of the present disclosure is to provide an alternative method and device allowing for an interconnection structure having improved electrical resistance properties. Further and alternative objectives may be understood from the following.

According to an aspect of the present disclosure, there is provided a method for forming an interconnection structure for a first transistor and a second transistor which are vertically stacked on a substrate, wherein the first transistor includes a horizontally extending first channel portion and the second transistor includes a horizontally extending second channel portion, and wherein the first channel portion is arranged above the second channel portion. The method comprises:

forming, in the substrate, a conductive line extending beside and below the second channel portion;
forming, on the conductive line, a first vertical interconnect structure for electrically contacting the first channel portion;
thinning the substrate from the backside to expose the conductive line from below;
forming a via hole exposing the second channel portion from below;
filling the via hole with a conductive material to form a second vertical interconnect structure; and
forming a conductive structure on the second vertical interconnect structure.

According to a second aspect, there is provided a semiconductor device, comprising a first transistor and a second transistor vertically stacked on a substrate, wherein the first transistor includes a horizontally extending first channel portion and the second transistor includes a horizontally extending second channel portion, and wherein the first channel portion is arranged above the second channel portion. The semiconductor device further comprises a conductive line arranged in the substrate and extending beside and below the second channel portion, a first vertical interconnect structure arranged on the conductive line and for contacting the first channel portion, a conductive structure arranged below the second channel portion, and a second vertical interconnect structure extending between the second channel portion and the conductive structure.

The present disclosure allows for an alternative technology for forming the interconnection structure, wherein the first channel portion is interconnected to a first conductive line, which also may be referred to as a first buried power rail, by means of a first vertical interconnection structure formed on top of the buried power rail and extending all the way up to the vertical level of the first channel portion. The first vertical interconnection structure may be provided with lateral dimensions allowing for a specific electrical resistance to be obtained. Generally, the lateral dimensions of the first vertical interconnection structure may be larger than those of a conventional via structure so as to reduce the electrical resistance.

The present disclosure further allows for the second channel portion to be contacted from below by means of a second vertical interconnection structure. Thereafter, the second conductive line, which also may be referred to as a second buried interconnect, may be formed on the second vertical interconnection structure and may thus be aligned with the second channel portion. Similar to the first vertical interconnection structure, the second vertical interconnection structure may be dimensioned so as to allow for a specific electrical resistance to the obtained.

It will be appreciated that the first and second channel portions extend horizontally, that is, along a main plane of extension of the substrate, and may be arranged above each other in the vertical direction, orthogonal to the main plane of extension of the substrate. Further, it will be appreciated that the first and second channel portions may be arranged on the same side of the substrate. Each of the first and second channel portions may comprise one or several layers, such as nanosheets, depending on the design and configuration of the resulting transistor devices to be formed. Further, as used herein, the term "channel portion" may be understood to include interconnect structures at least partly encapsulating the channel portion. Thus, the above-mentioned first/second vertical interconnect structures may be arranged to electrically contact the first/second channel portions via a gate structure, or a source/drain interconnect structure, at least partly encapsulating the respective channel portions.

The term "substrate" may be understood as an underlying layer of for instance silicon or a dielectric material, above which the first and second channel portions are arranged.

The first conductive line, which also may be referred to as a buried power rail, may be formed by etching a recess or trench into the substrate, at a position beside the stack formed by the first and second channel portions, and filling the recess with an electrically conducting material. The first conductive line may, in some examples, be formed in a trench extending through an insulating layer, such as an interlayer dielectric, ILD, arranged above the substrate. The resulting conductive line may thus be arranged partly in the substrate, partly in the insulating layer. Further, it will be appreciated that while at least a bottom portion of the first conductive line may be buried in the substrate, the conductive line may have a vertical extension allowing an upper portion of the conductive line to be arranged at a same vertical level as the second channel portion, or above.

In some examples, a first conductive line may be arranged on both sides of the stack formed by the first and second channel portions.

The first conductive line(s) may be formed after the forming of the first and second channel portions, for instance, by patterning the substrate (and possibly any insulating layer arranged thereon) by means of a sequence of lithography and etching steps. In alternative examples, the first conductive line(s), or parts thereof, may be formed prior to forming the stack of first and second channel portions. In case of the latter, the first conductive line(s) may for example be formed prior to depositing the layers from which the first and second channel portions are to be formed.

The first vertical interconnection structure may be formed by etching a recess or trench in an insulating layer covering the stack of first and second channel portions as well as the first conductive line. The insulating layer may be etched down to the first conductive line so as to expose at least a portion thereof, such as a gate structure of the channel portion, thereby allowing for the first conductive line to be electrically contacted by an electrically conductive material deposited in the recess to form the first vertical interconnection structure. The size and configuration of the first vertical interconnection structure may be selected depending on a desired electrical resistance to be achieved, which will be described in greater detail below.

The conductive structure, to which the second channel portion is connected, may be formed from below by flipping the substrate, i.e., turning it upside down, and thinning the substrate from the backside to expose the conductive line from below. The conductive structure and the second vertical interconnect may be formed in separate processes or in a common depositing process, as also will be discussed in further detail below. Further, the conductive structure may form a line, similar to the conductive line described above, or a plug, depending on how the interconnection structure is going to be used in subsequent back end of line, BEOL, processing.

It will thus be appreciated that, in the context of the present disclosure, the substrate may be described in terms of its frontside and backside, where the first and second channel portions are arranged on the frontside and the processing from the backside may be understood as processing on the side opposing the one on which the first and second channel portions are arranged. Processing "from the backside" may also be referred to as "from below", regardless of whether the substrate has been flipped or not.

An insulating layer may be deposited to cover the first conductive line as well as the first and second channel portions. A trench may then be etched in the insulating layer to expose the first conductive line and the first and second channel portions. Thereafter, spacers may be formed at sidewalls of the first and second channel portions, prior to the trench is filled with a conductive material forming the first vertical interconnect structure contacting the first channel portion.

The trench may be defined by means of a sequence of lithography and etching steps, and the lateral width and length of the trench defining the cross section of the resulting vertical interconnection structure. Increasing the area of the cross section may, for example, help reduce the electrical resistance of the vertical interconnection structure. The trench may be formed at one side of the stack formed by the first and second channel portions, or at two opposing sides of the stack, generally so as to accommodate the entire stack.

The spacers may be provided to separate the first interconnection structure from the second channel portion. Thus, the spacers may be formed of a dielectric material providing an electrical insulation between the second channel portion and the conductive material of the first vertical interconnection structure. The spacers may, for example, be formed by an oxide, such as silicon oxide, and may be provided as a conformal layer which is then subject to an anisotropic etch defining the spacers on vertical sidewalls of the trench while exposing the first conductive line and at least a top portion of the first channel portion. Generally, the spacers are vertically recessed to expose at least a portion of the sidewalls of the first channel portion, thereby increasing the contact surface between the conductive material and the first channel portion.

The conductive material may be deposited to contact the first channel portion at least partly from above, and/or at exposed side portions of the first channel portion which are not covered by the spacers.

The present disclosure could be contrasted with conventional via forming, where alignment challenges and aspect ratio limitations risk to shortcut the second channel portion. By opening a relatively large trench, the minimum lateral separation between the vertical interconnect structure and the second channel portion may be defined by the thickness of the spacer. As the spacer can be formed by for instance a conformal deposition process, the separation can be controlled in a more accurate and precise manner.

A bonding layer may be formed above the first vertical interconnect structure. The bonding layer may be used for bonding a carrier wafer, allowing for the substrate to be flipped upside down to facilitate processing of the second vertical interconnect structure and the conductive structure, interconnecting the second channel portion from below.

Processing the second vertical interconnect structure may involve forming a recess or trench in the backside of the substrate, wherein the trench may be aligned with the second channel portion. A via hole may be formed in the bottom of the trench, exposing a portion of the second channel portion to allow it to be contacted by the second interconnect structure. The via hole may then be filled by a conductive material forming the second vertical interconnect structure. In some examples, the conductive material may be deposited to also fill the trench, thereby simultaneously forming also the conductive structure (also referred so as the second buried power rail). Similar to the first vertical interconnect structure, the lateral dimensions of the via hole may define the cross-sectional area of the second vertical interconnect structure and thus affect its electrical resistance. As the second channel portion is the one arranged closer to the backside of the substrate, the second vertical interconnect structure may be shorter than the first vertical interconnect structure and may thus have a smaller cross-sectional area.

Generally, the conductive line interconnecting the first channel portion and the conductive structure interconnecting the second channel portion may be arranged on the same vertical level. This may be understood as at least a portion of each structure being arranged at the same level, such as for example a respective portion exposed at the backside of the substrate. This may facilitate subsequent back end of line, BEOL, processing.

The first and second channel portions may be formed by epitaxially forming a stacked structure comprising alternating layers of a channel material and a sacrificial material. The stacked structure may then be patterned into a fin, and the layers of sacrificial material removed from at least a portion of the fin such that the remaining channel material portions form the first and second channel portions. The channel material and the sacrificial material may be etch-selective in relation to each other to allow for a release of the channel portions. In some examples, the channel material may be formed of silicon and the sacrificial material of silicon germanium, or vice versa.

A channel portion may comprise one or more gate layers, for instance arranged in a gate layer stack, forming a gate structure. The gate structure may at least partly enclose the channel portion. The gate layers may comprise a gate dielectric, for instance including a low-k dielectric and/or a high-k dielectric, as well as one or several conductive gate layers or metal layers. The gate layer may, for example, be deposited following the release of the channel portions, or after the forming of the trench used for forming the first vertical interconnect structure.

The substrate may comprise an etch stop layer, acting as an etch stop when forming the trench for the first conductive line. In an example, the substrate may be formed of silicon and the etch stop layer of silicon germanium. The etch stop layer may be removed in the thinning process, in which the first conductive line is exposed from the backside.

BRIEF DESCRIPTION OF DRAWINGS

The above, as well as additional objects, features and benefits of the present disclosure, will be better understood through the following illustrative and non-limiting detailed description, with reference to the appended drawings. In the drawings like reference numerals will be used for like elements unless stated otherwise.

FIG. 1 shows a representative stacked structure comprising a first channel portion 112 and a second channel portion 122 for a respective transistor device which, during operation, conducts current through the channel portions along a horizontal direction (out of the plane of the figure). The first channel portion 112 and the second channel portion 122 are vertically stacked above a substrate 100, with the first channel portion 112 arranged above the second channel portion 122 as seen along a normal direction from the substrate 100.

FIG. 2 shows a pair of conductive lines 130 has been formed at a respective side of the first and second channel portions 112, 122.

FIG. 3 shows the arrangement in FIG. 2 after a trench 152 has been formed in the insulating layer to expose the conductive line 130 and the first and second channel portions 112, 122.

FIG. 4 shows, spacers 154 formed at sidewalls of the first and second channel portions 112, 122. The conformal insulating material layer may thus cover both lateral and horizontal surfaces in the trench 152.

FIG. 5 shows spacers 154 formed at sidewalls of the first and second channel portions 112, 122.

FIG. 6 shows the trench 152 filled with a conductive material forming the first vertical interconnect structure 132.

The first vertical interconnect structure 132 may thus extend from the conductive line 130 all the way up to the first channel portion 112. The gate structure 134, at least partly encapsulating the first channel portion 112, may be contacted at least from above by the first vertical interconnect structure 132, and further at portions of the sidewalls of the first channel portion 112 which are not covered by the spacers 154.

FIG. 7 shows subsequent processing where the back end of line, BEOL, part of the fabrication, metallisation layers 170 may be added above the first channel portion 112 and the first vertical interconnect 132.

FIG. 8 shows the result of thinning the substrate 100 from the backside, usually down to the etch stop layer 104, followed by a planarizing step (such as CMP) to expose the conductive lines 130 from below.

FIG. 9 shows that the remaining substrate material has been removed, generally in an etch process utilising an etch selectivity between the substrate material and the surrounding insulating layer 150. As shown, a via hole, or recess 144 is formed, which is aligned with the second channel portion 122.

FIG. 10 shows a via hole 146 etched through the insulating material to expose the underlying second channel portion 122 and allow it to be contacted by a second vertical interconnect structure.

DETAILED DESCRIPTION OF THE PRESENT DISCLOSURE

A method for forming an interconnection structure, suitable for instance for a semiconductor device, will now be described with reference to FIGS. 1-10. The method will be described in connection with forming an interconnection structure for a first and a second channel portion of a respective horizontally arranged field-effect transistor, FET, formed from a fin structure. It is however noted that the method may be applicable for forming an interconnection structure for vertically stacked conductive structures in general, such as semiconductor device contacts (for instance source/drain contacts).

Figure 1:
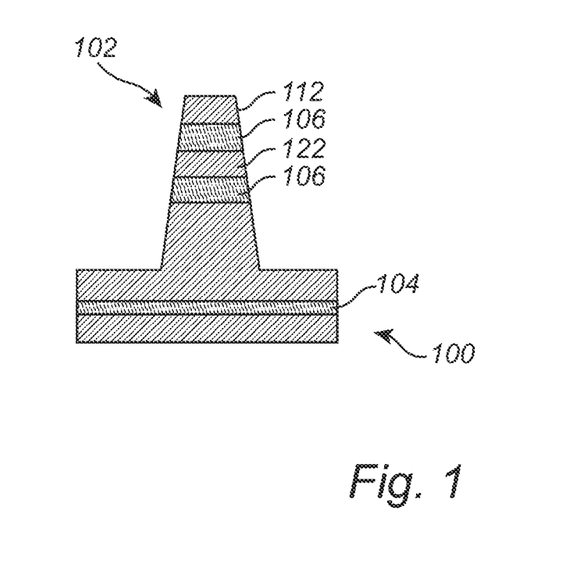
FIGS. 1-10 illustrate a method for forming an interconnection structure.

With reference to FIG. 1, a vertical cross section of an intermediate structure or device is shown. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. Further, it will be appreciated that other features and layers may have been omitted and that only those elements which are relevant for illustrating the present disclosure, as defined in the appended claims, may have been included in the drawings.

FIG. 1 shows a stacked structure comprising a first channel portion 112 and a second channel portion 122 for a respective transistor device which, during operation, conducts current through the channel portions along a horizontal direction (out of the plane of the figure). The first channel portion 112 and the second channel portion 122 are vertically stacked above a substrate 100, with the first channel portion 112 arranged above the second channel portion 122 as seen along a normal direction from the substrate 100.

In the present example, the channel portions 112, 122 may be formed from a stacked structure 102 comprising alternating layers of a channel material, forming the respective channel portions 112, 122 and a sacrificial material 106 arranged in between. The layer stack 102 may for instance be formed by epitaxial growth, such as a blanket epitaxy process, and patterned into for instance a fin as illustrated in FIG. 1. The fin may for instance be formed using a sequence of lithography and etching steps, also referred to as a litho-etch sequence. A litho-etch sequence may generally comprise forming a photoresist mask layer on the layer which will be patterned, i.e., "the target layer". A pattern (e.g. a pattern of openings, trenches or line) may be lithographically defined in the photoresist layer and then transferred into the target layer by etching while using the patterned photoresist layer as an etch mask. The photoresist layer may thereafter be stripped from the target layer.

The channel material and the sacrificial material may be selected to allow a selective removal of the sacrificial material, for instance by means of a selective etch. The channel material may for example be formed of Si, and the sacrificial material of SiGe. As SiGe and Si can be etched at different etch rates, the contrast in etch rate can be used to release the channel portions 112, 122 by selectively removing the sacrificial layers 106 in between.

The substrate 100 may for example be a Si substrate, onto which the stacked structure of channel material layers and sacrificial material layers may be formed. For the purpose of the present disclosure the channel material layers may be considered as arranged on the frontside of the substrate, with the first channel portion 112 arranged above the second channel portion 122 which hence is located between the first channel portion 112 and an upper surface of the substrate 100.

Figure 2:
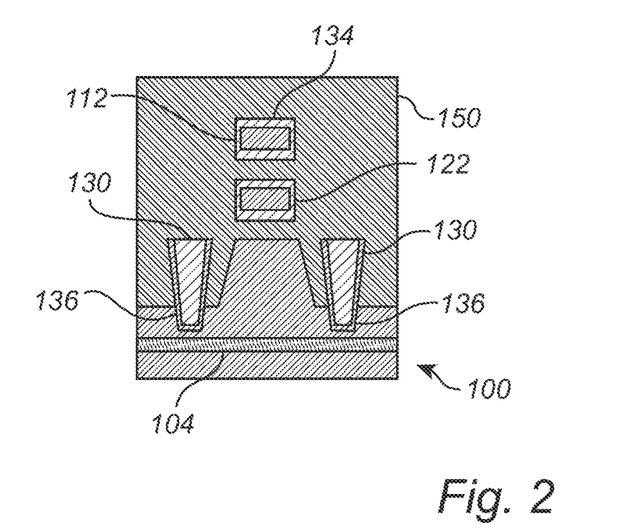

In FIG. 2, a pair of conductive lines 130 has been formed at a respective side of the first and second channel portions 112, 122. While the present figure illustrates two conductive lines 130, it will be appreciated that the present disclosure is also applicable for asymmetric configurations, comprising for instance a single conductive line 130. The conductive line 130 may in some examples be referred to as a buried power rail. The conductive line 130 may be formed in a trench extending in the substrate 100 and, in some examples, along at least a portion of the first and second channel portions 112, 122. The trench may for example be etched down to the etch stop layer 104. As illustrated in the present figure, the conductive lines 130 may be arranged vertically below and laterally beside the first channel portion 112 and usually also the second channel portion 122. Further, the conductive line 130 may at least partly extend also in an insulating layer 150, such as an interlayer dielectric, ILD, arranged above the substrate 100. The conductive line 130 may be formed in two steps, in which a bottom portion of the conductive line 130 is formed in a trench in the substrate 100 and the remaining portion of the conductive line 130 is formed in a trench in the insulating layer 150. Alternatively, the conductive line 130 is formed in a single filling process, in which a trench is formed in the insulating layer 150 and extending all the way into the substrate 100. The conductive line 130 may comprise one or several layers, such as for example a barrier layer 136 arranged between the substrate 100 and the conductive material forming the conductive line 130.

The insulating layer 150 may be a dielectric layer, such as a layer of silicon oxide or some other conventional low-k dielectric layer. The insulating layer 150 may be deposited by chemical vapour deposition, CVD, as one example.

The first and second channel portions 112, 122 may comprise, and/or be at least partly encapsulated by, a channel portion interconnect structure 134. The channel portion interconnect structure 134 may for example be arranged at the source/drain portions of the transistor structure or form a gate structure 134 at the respective channel portions 112, 122. The gate structure 134 may comprise one or several gate layers, depending on the type and configuration of the transistor structure of which the channel portions 112, 122 form part. The gate layers may for instance form a gate layer stack including a gate dielectric layer formed by any conventional gate dielectric material such as $HfO_2$, $ZrO_2$, $Al_2O_3$ or some other high-K dielectric material. The gate dielectric material may be deposited as a conformal thin film by any conventional deposition process, for instance by ALD. The gate layers may further comprise at least a first conductive gate layer that is subsequently formed on the gate dielectric layer. The first conductive gate layer may be formed by an effective work function metal (EWF). The first conductive gate layer may for instance be formed by one or more p-type EWF metals such as TiN, TaN, TiTaN or by one or more n-type EWF metals such as Al, TiAl, TiC, or TiAlC, or compound layers such as TiN/TiAl or TiN/TaN/TiAl. The first conductive gate layer may be deposited by any conventional deposition process, for instance by ALD, CVD or PVD. The gate layers may further include a second conductive gate layer, for instance of W, Al, Co, Ni, Ru or an alloy of two or more of said materials, to provide a gate electrode with the desired electrical properties. The second conductive gate layer may be deposited by any conventional deposition process, for instance by CVD or by electro-plating.

Figure 3:
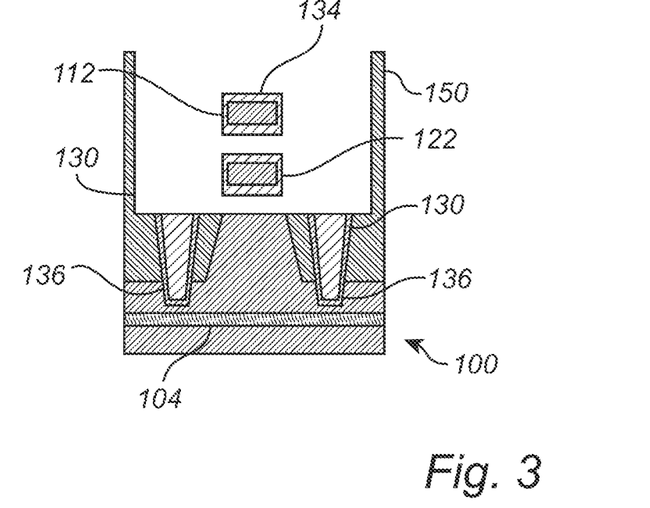

FIG. 3 shows the arrangement in FIG. 2 after a trench 152 has been formed in the insulating layer to expose the conductive line 130 and the first and second channel portions 112, 122. The trench 152 may for example be formed using a litho-etch sequence as mentioned above. In the present example, where a conductive line 130 is arranged on a respective side of the stack of channel portions 112, 122 the trench may be arranged to extend laterally on both sides of the stack of channel portions 112, 122 so as to allow both conductive lines 130 to be exposed at the bottom of the trench 152.

Figure 4:
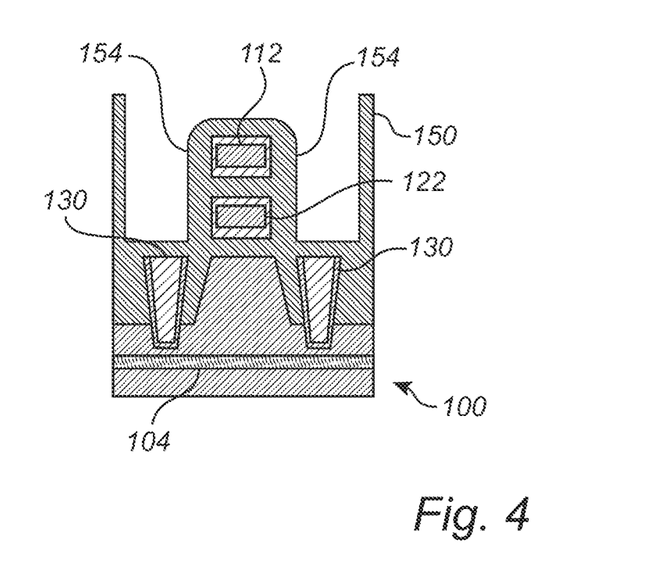
Figure 5:
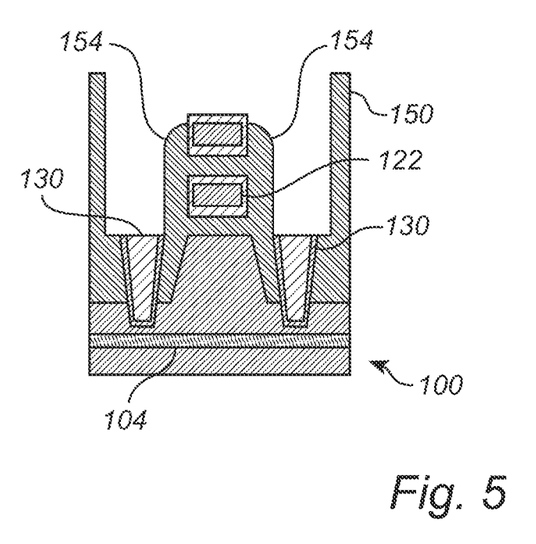

In FIGS. 4 and 5, spacers 154 have been formed at sidewalls of the first and second channel portions 112, 122. The spacers 154 may for example be formed of an insulating material, for instance oxide, which may be conformally deposited in the trench 152. The conformal insulating material layer, shown in FIG. 4, may thus cover both lateral and horizontal surfaces in the trench 152. To form the spacers 154, the insulating material layer may be subject to anisotropic etching to expose horizontal structures such as top surfaces of the conductive lines 130 in the bottom of the trench 152 as well as a top surface of the first channel portion 112, while leaving insulating spacers 154 on vertical sidewalls of for instance the second channel portion 122. The spacers 154 may thus provide electrical insulation for the second channel portion 122.

Figure 6:
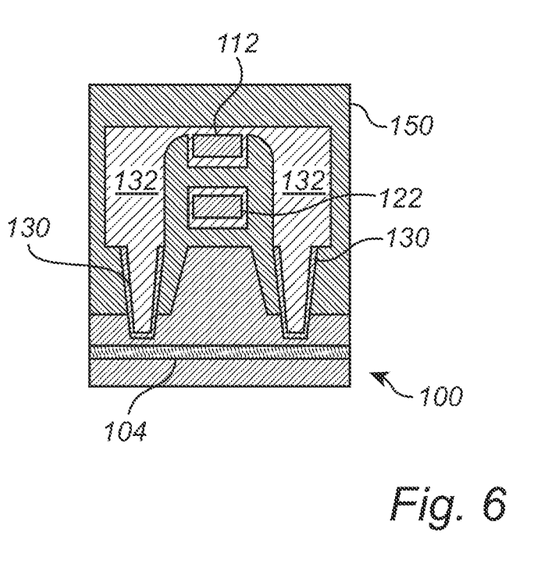

In FIG. 6, the trench 152 has been filled with a conductive material forming the first vertical interconnect structure 132. The first vertical interconnect structure 132 may thus extend from the conductive line 130 all the way up to the first channel portion 112. The gate structure 134, at least partly encapsulating the first channel portion 112, may be contacted at least from above by the first vertical interconnect structure 132, and further at portions of the sidewalls of the first channel portion 112 which are not covered by the spacers 154. Thus, the first vertical interconnect structure 132 provides an electrical interconnection between the first channel portion, or top channel portion 112, and the conductive line 130 (also referred to as top buried power rail). At the same time, the spacers 154 may prevent the second channel portion 122 from being contacted by the first vertical interconnect 132 passing beside the second channel portion 122.

The conductive line 130 and the first vertical interconnect structure 132 may for instance be formed in a damascene like process, in which a trench (such as trench 152) is filled with a conductive material, for instance tungsten, recessed by for instance chemical-mechanical polishing, and covered by an insulating layer of for example an oxide. The resulting structure is illustrated in FIG. 6.

Figure 7:
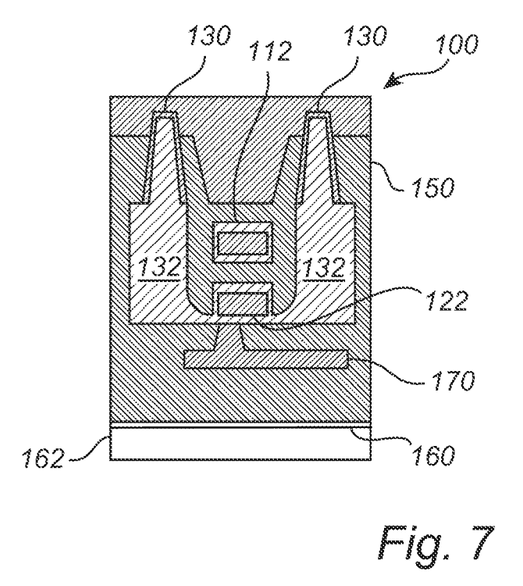

In subsequent processing, for instance the back end of line, BEOL, part of the fabrication, metallisation layers 170 may be added above the first channel portion 112 and the first vertical interconnect 132, as illustrated in FIG. 7.

Figure 8:
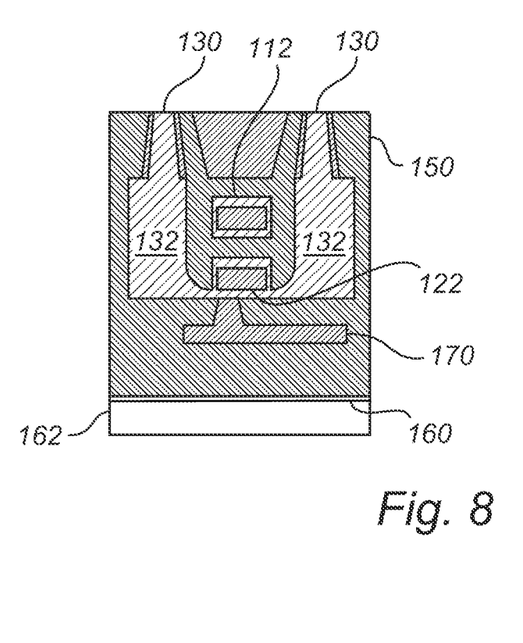

In order to allow the processing to be continued from below, that is, from the backside, the substrate 100 may be turned upside down and bonded to a carrier wafer 162. In the example of FIG. 7, the substrate 100 is bonded face-down to a carrier wafer 162, usually by means of a bonding layer 160 arranged between the substrate 100 and the carrier wafer 162. The BEOL metallization layer 170 is indicated for exemplary purposes. As further illustrated in FIG. 7, the substrate 100 may be thinned from the backside, usually down to the etch stop layer 104, followed by a planarizing step (such as CMP) to expose the conductive lines 130 from below. The resulting structure is shown in FIG. 8.

Figure 9:
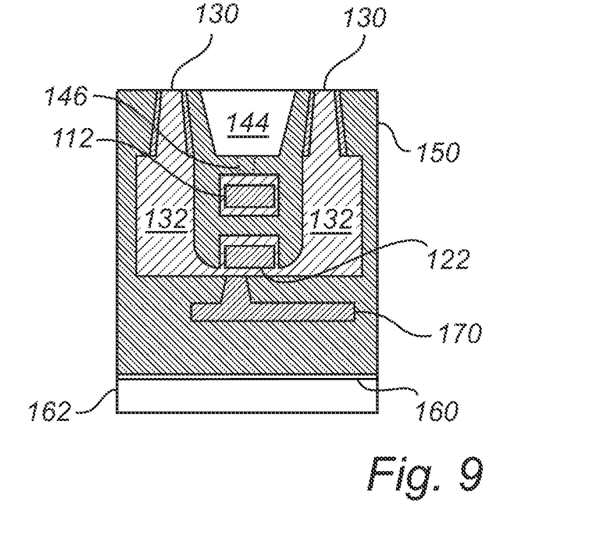

In FIG. 9, the remaining substrate material has been removed, generally in an etch process utilising an etch selectivity between the substrate material and the surrounding insulating layer 150. As illustrated in the present figure a via hole, or recess 144 is formed, which is aligned with the second channel portion 122. The recess 144 may have a shape which in a first lateral direction, between the two conductive lines 130, is defined by the lateral extension of the previously removed substrate material (for instance corresponding to a width of the fin shown in FIG. 1) and in a second lateral direction, parallel to the conductive lines 130, is defined by the lithography process.

Figure 10:
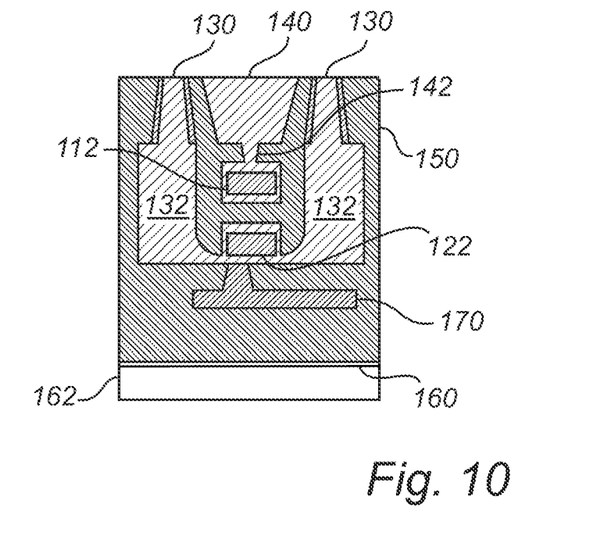

In the bottom of the recess 144 a via hole 146 may be formed, extending down to the gate structure 134 at least partly encapsulating the second channel portion 122. Thus, the via hole 146 may be etched through the insulating material to expose the underlying second channel portion 122 and allow it to be contacted by a second vertical interconnect structure, as shown in FIG. 10. The second vertical interconnect structure 142 may be formed by a conductive material deposited, for example by a damascene-style process, in the via hole 146 and extending up to the recess 144. The recess 144 may in some examples be filled by the same material and in the same processing step as the via hole 146, and in other examples by a separate material and/or process. The filled recess 144 shown in FIG. 10 forms a conductive structure, or second buried power rail, which may be arranged at a similar vertical level as the conductive lines 130 and provide a similar interconnection to the second channel portion 122.

The resulting interconnection structure shown in FIG. 10 allows for the first channel portion 112 to be electrically connected through (in this example two) conductive lines 130, and the second channel portion 122 to be electrically connected through a conductive structure 140 arranged between the two conductive lines 130. The first vertical interconnect structure 132 may be provided with a cross sectional area which is dimensioned to at least somewhat compensate for the increase in electrical resistance added by the height difference caused by the first channel portion being arranged at a different vertical level than the second channel portion 122.

What is claimed is:

1. A method for forming an interconnection structure for a first transistor and a second transistor vertically stacked on a substrate, wherein the first transistor includes a horizontally extending first channel portion and the second transistor includes a horizontally extending second channel portion, and wherein the first channel portion is arranged above the second channel portion, the method comprising:
   forming, in the substrate, a conductive line extending beside and below the second channel portion;
   forming, on the conductive line, a first vertical interconnect structure for electrically contacting the first channel portion;
   thinning the substrate from a backside to expose the conductive line from below;
   forming a via hole exposing the second channel portion from below;
   filling the via hole with a conductive material to form a second vertical interconnect structure; and
   forming a conductive structure on the second vertical interconnect structure.

2. The method according to claim 1, further comprising:
   forming a bonding layer above the first vertical interconnect structure;
   bonding a carrier wafer to the bonding layer; and
   flipping the substrate upside down to allow processing from the backside of the substrate.

3. The method according to claim 1, further comprising:
   depositing an insulating layer covering the conductive line and the first and second channel portions;
   etching a trench in the insulating layer to expose the conductive line and the first and second channel portions;
   forming spacers at sidewalls of the first and second channel portions; and
   filling the trench with the conductive material forming the first vertical interconnect structure contacting the first channel portion at least partly from above.

4. The method according to claim 3, further comprising:
   forming a bonding layer above the first vertical interconnect structure;
   bonding a carrier wafer to the bonding layer; and
   flipping the substrate upside down to allow processing from the backside of the substrate.

5. The method according to claim 2, further comprising:
   forming, from the backside, a trench that is aligned with the second channel portion;
   forming the via hole in a bottom of the trench; and
   depositing the conductive material to fill the via hole and the trench, thereby forming the second vertical interconnect structure and the conductive structure.

6. The method according to claim 1, wherein an exposed portion of the conductive line and an exposed portion of the conductive structure are arranged on the same vertical level.

7. The method according to claim 1, further comprising:
   epitaxially forming a stacked structure comprising alternating layers of a channel material and a sacrificial material;
   patterning the stacked structure into a fin; and
   removing the sacrificial material from at least a portion of the fin, wherein remaining portions of the channel material form the first and second channel portions.

8. The method according to claim 7, further comprising forming a gate structure at least partly enclosing the first and second channel portions.

9. The method according to claim 7, wherein the channel material is formed of Si and the sacrificial material is formed of SiGe.

10. The method according to claim 9, further comprising forming a gate structure at least partly enclosing the first and second channel portions.

11. The method according to claim 1, wherein the substrate comprises an etch stop layer, and wherein forming the conductive line comprises etching down to the etch stop layer.

12. The method according to claim 1, comprising forming, in the substrate, a first and a second conductive line on opposite sides of the second channel portion, wherein the first vertical interconnect structure is arranged to interconnect the second channel portion with each of the first and second conductive lines.

13. A semiconductor device, comprising:
 a first transistor and a second transistor vertically stacked on a substrate, wherein the first transistor includes a horizontally extending first channel portion and the second transistor includes a horizontally extending second channel portion, and wherein the first channel portion is arranged above the second channel portion;
 a conductive line formed in the substrate and extending beside and below the second channel portion;
 a first vertical interconnect structure formed on the conductive line for electrically contacting the first channel portion, wherein the substrate is configured to be thinned from a backside to expose the conductive line from below;
 a via hole formed to expose the second channel portion from below;
 a second vertical interconnect structure formed by filling the via hole with a conductive material; and
 a conductive structure formed on the second vertical interconnect structure.

14. The semiconductor device according to claim 13, wherein a bottom portion of the conductive line and a bottom portion of the conductive structure are arranged at the same vertical level.

* * * * *